(12) United States Patent
Tsuchida

(10) Patent No.: US 11,437,959 B2
(45) Date of Patent: *Sep. 6, 2022

(54) HIGH FREQUENCY AMPLIFICATION CIRCUIT, HIGH FREQUENCY FRONT-END CIRCUIT, AND COMMUNICATION DEVICE

(71) Applicant: Murata Manufacturing Co., Ltd., Kyoto (JP)

(72) Inventor: Shigeru Tsuchida, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 59 days.

This patent is subject to a terminal disclaimer.

(21) Appl. No.: 17/064,812

(22) Filed: Oct. 7, 2020

(65) Prior Publication Data

US 2021/0021242 A1   Jan. 21, 2021

Related U.S. Application Data

(63) Continuation of application No. 16/392,864, filed on Apr. 24, 2019, now Pat. No. 10,848,110.

(30) Foreign Application Priority Data

Apr. 25, 2018   (JP) .............................. JP2018-084360

(51) Int. Cl.
*H03F 1/02* (2006.01)
*H03F 3/191* (2006.01)
(Continued)

(52) U.S. Cl.
CPC ........... *H03F 3/191* (2013.01); *H03H 7/0161* (2013.01); *H03H 7/38* (2013.01); *H03H 7/465* (2013.01)

(58) Field of Classification Search
CPC ......................................................... H03F 1/02
(Continued)

(56) References Cited

U.S. PATENT DOCUMENTS 6,130,589 A     10/2000  Yamaguchi
8,130,787 B2 *  3/2012   Hagiwara ............ H04B 7/0842
                                                  370/463

(Continued)

FOREIGN PATENT DOCUMENTS

JP    H10-335980 A    12/1998
JP    2016-042699 A    3/2016
(Continued)

*Primary Examiner* — Henry Choe
(74) *Attorney, Agent, or Firm* — Pearne & Gordon LLP

(57) ABSTRACT

A high frequency amplification circuit includes transmission amplification circuits 11 and 12; a transmission filter D-Tx whose pass band is a band D of a first frequency band group; transmission filters E-Tx and G-Tx whose pass bands are respectively bands E and G of a second frequency band group; an output matching circuit 31 configured to match the transmission amplification circuit 11 and the transmission filter D-Tx; and an output matching circuit 32 configured to match the transmission amplification circuit 12 and the transmission filters E-Tx and G-Tx. The band D is positioned at a high frequency-side end portion of the first frequency band group, and the band E is positioned at a low frequency-side end portion of the second frequency band group. The output matching circuit 31 includes a low-pass circuit, and the output matching circuit 32 includes an impedance-variable circuit.

10 Claims, 10 Drawing Sheets

(51) Int. Cl.
    *H03H 7/46*           (2006.01)
    *H03H 7/38*           (2006.01)
    *H03H 7/01*           (2006.01)

(58) Field of Classification Search
    USPC .............................................. 330/124 R, 295
    See application file for complete search history.

(56) References Cited

U.S. PATENT DOCUMENTS

| | | | |
|---|---|---|---|
| 2004/0127182 A1* | 7/2004 | Hayashi | H04B 1/0057 |
| | | | 455/193.1 |
| 2016/0191105 A1 | 6/2016 | King et al. | |
| 2017/0163229 A1 | 6/2017 | Oyama | |
| 2017/0310287 A1 | 10/2017 | Koya | |

FOREIGN PATENT DOCUMENTS

| | | | |
|---|---|---|---|
| JP | 2017-103655 A | 6/2017 | |
| JP | 2017-195536 A | 10/2017 | |

\* cited by examiner

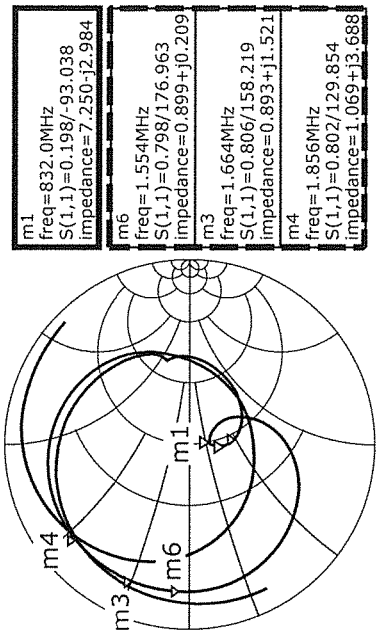
FIG. 6B  DTC=1.8pF(B20/26)
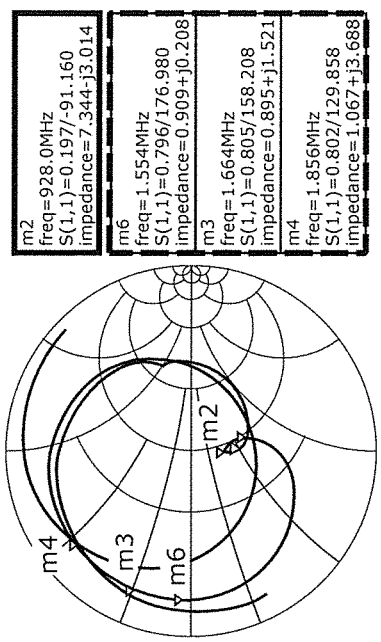
FIG. 6A  DTC=1.1pF(B8)
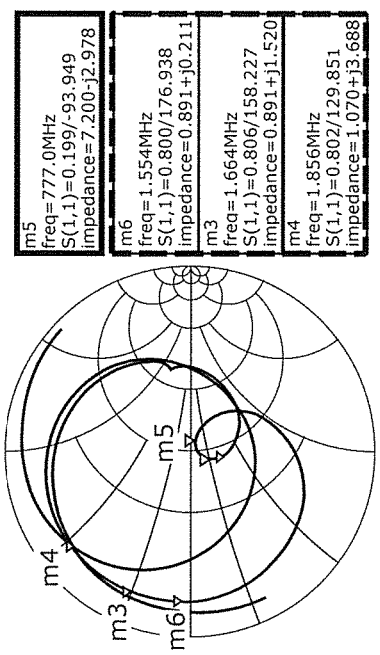
FIG. 6C  DTC=2.5pF(B13/14)

HIGH FREQUENCY AMPLIFICATION CIRCUIT, HIGH FREQUENCY FRONT-END CIRCUIT, AND COMMUNICATION DEVICE

This application is a continuation of U.S. patent application Ser. No. 16/392,864 filed on Apr. 24, 2019, which claims priority from Japanese Patent Application No. 2018-084360 filed on Apr. 25, 2018. The contents of these applications are incorporated herein by reference in their entirety.

BACKGROUND

The present disclosure relates to high frequency amplification circuits, high frequency front-end circuits, and communication devices. In mobile communication terminals such as a cellular phone, a power amplification module corresponding to a multi-band configuration is used.

Japanese Unexamined Patent Application Publication No. 2017-103655 discloses a power amplification module for suppressing generation of noise in a reception frequency band. The power amplification module disclosed in Japanese Unexamined Patent Application Publication No. 2017-103655 includes a first amplification circuit (PA1 and PA2) for amplifying a first high frequency transmission signal inputted from a first input terminal (IN3) and outputting the amplified signal to a first output terminal (SW3), and a second amplification circuit (PA3 and PA5) for amplifying a second high frequency transmission signal inputted from a second input terminal (IN1) and outputting the amplified signal to a second output terminal (SW4). The power amplification module further includes an attenuation circuit (MN3) disposed between the first amplification circuit and the first output terminal, and an attenuation circuit (MN7) disposed between the second amplification circuit and the second output terminal.

In the power amplification module disclosed in Japanese Unexamined Patent Application Publication No. 2017-103655, for example, a high frequency transmission signal of a band belonging to a low frequency-side band group (e.g., low band group) is inputted from the second input terminal (IN1), and a high frequency transmission signal of a band belonging to a high frequency-side band group (e.g., high band group) is inputted from the first input terminal (IN3). Here, the second output terminal (SW4) is switched in response to the band of the high frequency transmission signal inputted from the second input terminal, and the first output terminal (SW3) is switched in response to the band of the high frequency transmission signal inputted from the first input terminal. Thus, the high frequency transmission signals respectively inputted from the first input terminal and the second input terminal are transmitted to filter circuits connected to a subsequent stage. At this time, since there is a limit in improving bandpass characteristics of the high frequency transmission signals by the filter circuits in the subsequent stage, bandpass characteristics of the attenuation circuits (MN3 and MN7) included in the power amplification module can be optimized.

For example, when a high frequency transmission signal of a first band positioned at a high frequency-side end portion in a frequency range of the low frequency-side band group is inputted from the second input terminal (IN1) and transmitted through the power amplification module, it is necessary to sufficiently attenuate a harmonic of the first band in order to suppress a situation in which the harmonic of the first band interferes with high frequency transmission signals of other bands. In this case, since attenuation characteristics of the harmonic cannot be sufficiently satisfied by the filter circuit in the subsequent stage, for the attenuation circuit (MN3) of the power amplification module, the first band can be passed therethrough with low loss and the harmonic of the first band can be sufficiently attenuated.

Here, in a case where a high frequency transmission signal of a second band adjacent to a high frequency side of the first band is also inputted from the second input terminal (IN1), since the second band is positioned between the first band and the harmonic of the first band, there arises a problem that the transmission loss of the second band is worsened when the high frequency transmission signal of the second band passes through the attenuation circuit (MN3) putting an emphasis on the attenuation characteristics of the harmonic.

BRIEF SUMMARY

Accordingly, the present disclosure provides a high frequency amplification circuit, a high frequency front-end circuit, and a communication device capable of attenuating a harmonic of a band positioned at a high frequency-side end portion of a frequency band group including a plurality of bands, and also capable of transmitting, with low loss, a high frequency transmission signal of a band adjacent to a high frequency side of the above band.

A high frequency amplification circuit according to an aspect of the present disclosure includes a first transmission amplification circuit configured to amplify a high frequency transmission signal of a first frequency band group; a second transmission amplification circuit configured to amplify a high frequency transmission signal of a second frequency band group adjacent to a high frequency side of the first frequency band group; a first filter whose pass band is a first band belonging to the first frequency band group; a second filter whose pass band is a second band belonging to the second frequency band group; a third filter whose pass band is a third band belonging to the second frequency band group and positioned on a high frequency side relative to the second band; a first output matching circuit disposed between an output terminal of the first transmission amplification circuit and an input terminal of the first filter, and configured to achieve impedance matching between the first transmission amplification circuit and the first filter; and a second output matching circuit disposed between an output terminal of the second transmission amplification circuit and input terminals of the second filter and the third filter, and configured to achieve impedance matching between the second transmission amplification circuit and the second filter as well as the third filter. The first band is positioned at a high frequency-side end portion in a frequency range of the first frequency band group; the second band is positioned at a low frequency-side end portion in a frequency range of the second frequency band group; a frequency of a harmonic of a high frequency transmission signal of the first band is higher than the second band; the first output matching circuit includes a low-pass circuit in which the first band is set as a pass band and the frequency of the harmonic is set as an attenuation band; and the second output matching circuit includes an impedance-variable circuit configured to vary impedance in a pass band in response to the second band and the third band.

Further, a high frequency front-end circuit according to an aspect of the present disclosure is a high frequency front-end circuit that is capable of simultaneously transmitting a high frequency signal of one or more frequency bands among a plurality of frequency bands belonging to a first frequency band group or a high frequency signal of one or more frequency bands among a plurality of frequency bands belonging to a second frequency band group positioned on a high frequency side relative to the first frequency band group, and a high frequency signal of one or more frequency bands among a plurality of frequency bands belonging to a third frequency band group positioned on a high frequency side relative to the second frequency band group, and that includes the above-mentioned high frequency amplification circuit; a third transmission amplification circuit configured to amplify a high frequency transmission signal of the third frequency band group; a fourth filter whose pass band is a fourth band belonging to the third frequency band group; and a multiplexer which includes a common input-output terminal, a first input-output terminal and a second input-output terminal, and in which high frequency transmission signals outputted from the first filter, the second filter and the third filter are inputted to the first input-output terminal, and a high frequency transmission signal outputted from the fourth filter is inputted to the second input-output terminal. A frequency of a harmonic of a high frequency transmission signal of the first band overlaps the fourth band. The multiplexer includes a first wide-band filter that is connected to the common input-output terminal and the first input-output terminal and sets a frequency range including the first frequency band group and the second frequency band group as a pass band, and also includes a second wide-band filter that is connected to the common input-output terminal and the second input-output terminal and sets a frequency range of the third frequency band group as a pass band.

Furthermore, a communication device according to an aspect of the present disclosure includes an RF signal processing circuit configured to process a high frequency transmission signal, and the above-described high frequency front-end circuit configured to transmit, to an antenna element, the high frequency transmission signal outputted from the RF signal processing circuit.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIGS. 6A to 6C are Smith charts showing impedance characteristics of the second output matching circuit according to the working example;

DETAILED DESCRIPTION

Figure 1:
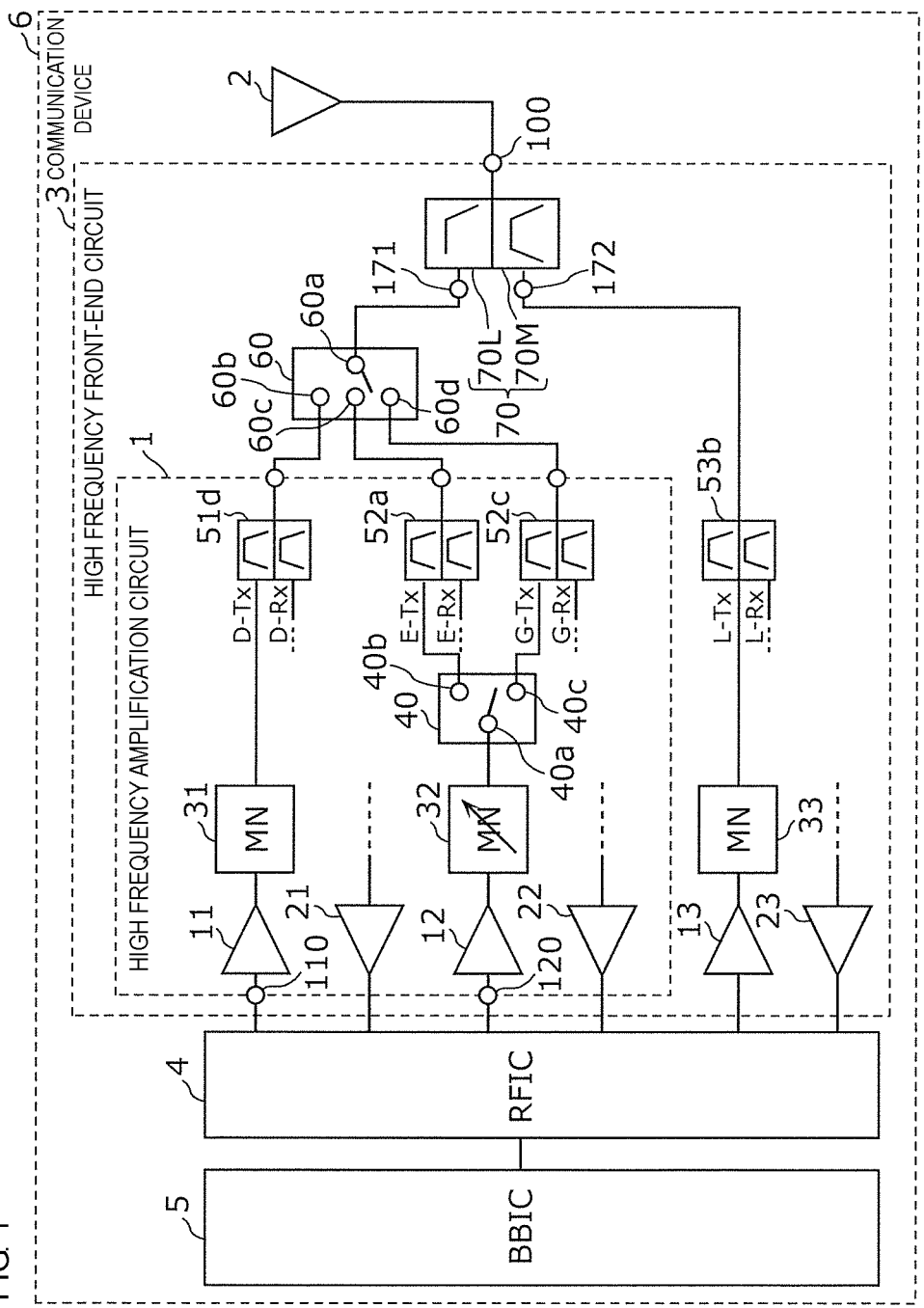
FIG. 1 is a circuit configuration diagram of a communication device according to an embodiment.

Hereinafter, embodiments of the present disclosure will be described in detail with reference to the accompanying drawings. Note that each of working examples described below represents a comprehensive or specific example. Numerical values, shapes, materials, constituent elements, arrangement and connection modes of the constituent elements, and the like indicated in the following working examples are merely exemplary and are not intended to limit the present disclosure. Of the constituent elements in the following working examples, those that are not described in the independent claims will be described as arbitrary constituent elements. In addition, sizes or the ratio of sizes of the constituent elements illustrated in the drawings may not necessarily be precise.

Embodiment 1.1 Communication Device Configuration According to Embodiment

FIG. 1 is a circuit configuration diagram of a communication device 6 according to an embodiment. As illustrated in FIG. 1, the communication device 6 includes an antenna element 2, a high frequency front-end circuit 3, an RF signal processing circuit (RFIC) 4, and a baseband signal processing circuit (BBIC) 5.

The high frequency front-end circuit 3 includes a high frequency amplification circuit 1, a switch circuit 60, a diplexer 70, a transmission amplification circuit 13, a reception amplification circuit 23, an output matching circuit 33, and a duplexer 53b.

The high frequency amplification circuit 1 includes transmission amplification circuits 11 and 12, duplexers 51d, 52a and 52c, output matching circuits 31 and 32, reception amplification circuits 21 and 22, and a switch circuit 40.

The transmission amplification circuit 11 is a first transmission amplification circuit configured to amplify a high frequency transmission signal of a first frequency band group. The transmission amplification circuit 12 is a second transmission amplification circuit configured to amplify a high frequency transmission signal of a second frequency band group adjacent to a high frequency side relative to the first frequency band group.

The duplexer 51d is a duplexer that is constituted of a transmission filter D-Tx and a reception filter D-Rx and sets a band D (first band) belonging to the first frequency band group as a pass band. The transmission filter D-Tx is a first filter whose pass band is a transmission band of the band D (first band).

The duplexer 52a is a duplexer that is constituted of a transmission filter E-Tx and a reception filter E-Rx and sets a band E (second band) belonging to the second frequency band group as a pass band. The transmission filter E-Tx is a second filter whose pass band is a transmission band of the band E (second band).

The duplexer 52c is a duplexer that is constituted of a transmission filter G-Tx and a reception filter G-Rx, and sets, as a pass band, a band G (third band) belonging to the second frequency band group and positioned on a high frequency side relative to the band E (second band). The transmission filter G-Tx is a third filter whose pass band is a transmission band of the band G (third band).

The output matching circuit 31 is a first output matching circuit disposed between an output terminal of the transmission amplification circuit 11 and an input terminal of the transmission filter D-Tx and configured to achieve impedance matching between the transmission amplification circuit 11 and the transmission filter D-Tx.

The output matching circuit 32 is a second output matching circuit disposed between an output terminal of the transmission amplification circuit 12 and input terminals of the transmission filter E-Tx and the transmission filter G-Tx and configured to achieve impedance matching between the transmission amplification circuit 12 and the transmission filter E-Tx as well as the transmission filter G-Tx. The output matching circuit 32 is connected to the transmission filter E-Tx and the transmission filter G-Tx via the switch circuit 40.

The switch circuit 40 includes a common terminal 40a and selection terminals 40b and 40c, and exclusively performs switching between the connection of the output matching circuit 32 with the transmission filter E-Tx and the connection of the output matching circuit 32 with the transmission filter G-Tx. The switch circuit 40 is, for example, a single pole double throw (SPDT) type switch. The switch circuit 40 is not necessarily a constituent element in such operations in which the high frequency transmission signal of the band E is propagated through the transmission filter E-Tx and the high frequency transmission signal of the band G is propagated through the transmission filter G-Tx.

The reception amplification circuit 21 amplifies a high frequency reception signal of the first frequency band group having passed through the reception filter D-Rx. The reception amplification circuit 22 amplifies a high frequency reception signal of the second frequency band group having passed through the reception filter E-Rx or the reception filter G-Rx.

The high frequency amplification circuit 1 may be a high frequency amplification circuit of a transmission system in which only a high frequency transmission signal of high frequency transmission and high frequency reception signals is propagated. In this case, the reception amplification circuits 21 and 22 are not necessary. Further, in this case, the duplexer 51d may be constituted of only the transmission filter D-Tx of the transmission filter D-Tx and the reception filter D-Rx. Furthermore, the duplexer 52a may be constituted of only the transmission filter E-Tx of the transmission filter E-Tx and the reception filter E-Rx. In addition, the duplexer 52c may be constituted of only the transmission filter G-Tx of the transmission filter G-Tx and the reception filter G-Rx.

In the high frequency amplification circuit 1 according to the present embodiment, the band D is positioned at a high frequency-side end portion in a frequency range of the first frequency band group, the band E is positioned at a low frequency-side end portion in a frequency range of the second frequency band group, and a frequency of a second-order harmonic of the high frequency transmission signal of the band D ($2 \times F_D$) is higher than the band E.

The output matching circuit 31 includes a low-pass circuit in which the band D is set as a pass band and the frequency of the second-order harmonic of the high frequency transmission signal of the band D ($2 \times F_D$) is set as an attenuation band. The output matching circuit 32 includes an impedance-variable circuit configured to vary a pass band in response to the band E and the band G.

According to the above configuration of the high frequency amplification circuit 1, it is possible to select one or more signal paths among a plurality of signal paths for transmitting high frequency transmission signals of the plurality of bands D, E, and G belonging to the first frequency band group and the second frequency band group adjacent to each other, and then transmit a high frequency transmission signal. In the high frequency amplification circuit 1, the transmission amplification circuit 11 having optimum amplification characteristics in the first frequency band group is disposed in a signal path for transmitting the high frequency transmission signal of the first frequency band group, and the transmission amplification circuit 12 having optimum amplification characteristics in the second frequency band group is disposed in a signal path for transmitting the high frequency transmission signal of the second frequency band group.

The transmission filter D-Tx, in which the band D positioned at the high frequency-side end portion in the frequency range of the first frequency band group is set as a pass band, is required to have characteristics for attenuating a harmonic of the band D in order to suppress a situation in which the harmonic interferes with high frequency signals of other bands. In this case, since there is a case where low loss of the pass band and the attenuation of the above harmonic cannot be sufficiently secured only by the transmission filter D-Tx, it is necessary for the output matching circuit 31 to allow the band D to pass through with low loss and to sufficiently attenuate the harmonic of the band D.

Here, it is assumed that the band E adjacent to the high frequency side of the band D belongs to the first frequency band group, and the signal path of the band E is connected to the transmission amplification circuit 11. In this case, since the band E is positioned between the band D and the second-order harmonic of the band D ($2 \times F_D$), when a high frequency transmission signal of the band E passes through the output matching circuit emphasizing the attenuation characteristics of the second-order harmonic, insertion loss of the band E is worsened.

In contrast, in the configuration of the high frequency amplification circuit 1 according to the present embodiment, the band E belongs to the second frequency band group, and the signal path of the band E is connected to the transmission amplification circuit 12. With this, since the output matching circuit 31 does not need to take into consideration the insertion loss of the band E, it is possible to achieve both low loss of the high frequency transmission signal of the band D and large attenuation of the second-order harmonic of the band D.

Meanwhile, since the band E is made to belong to the second frequency band group, the transmission amplification circuit 12 is required to have wide-band amplification characteristics covering the band E to be positioned at the low frequency-side end portion in the frequency range of the second frequency band group and the band G positioned at a high frequency side relative to the band E. On the other hand, since the output matching circuit 32 connected to the transmission amplification circuit 12 includes the impedance-variable circuit configured to vary and optimize the impedance matching in the pass band in response to the band E and the band G, high frequency transmission signals of the band E and the band G can be transmitted with low loss. In addition, since it is possible to achieve wide-band frequency characteristics covering the band E and band G by one output matching circuit 32 including the impedance-variable circuit without necessarily separately providing output matching circuits respectively corresponding to the band E and band G, the high frequency front-end circuit 3 can be simplified.

Accordingly, it is possible to transmit, with low loss, the band E positioned in a boundary band with the adjacent frequency band group (second frequency band group) while sufficiently attenuating the second-order harmonic of the band D positioned at the high frequency-side end portion of the low frequency-side band group (first frequency band group) among the frequency band groups adjacent to each other.

Next, constituent elements other than the high frequency amplification circuit 1 of the high frequency front-end circuit 3 according to the present embodiment will be described.

The transmission amplification circuit 13 is a third transmission amplification circuit configured to amplify a high frequency transmission signal of a third frequency band group positioned on a high frequency side relative to the second frequency band group.

The duplexer 53b is a duplexer that is constituted of a transmission filter L-Tx and a reception filter L-Rx and sets a band L (fourth band) belonging to the third frequency band group as a pass band. The transmission filter L-Tx is a fourth filter whose pass band is a transmission band of the band L (fourth band).

The reception amplification circuit 23 amplifies a high frequency reception signal of the third frequency band group having passed through the reception filter L-Rx.

The output matching circuit 33 is a circuit disposed between an output terminal of the transmission amplification circuit 13 and an input terminal of the transmission filter L-Tx and configured to achieve impedance matching between the transmission amplification circuit 13 and the transmission filter L-Tx.

The high frequency front-end circuit 3 may be a high frequency front-end circuit of a transmission system in which only a high frequency transmission signal of high frequency transmission and high frequency reception signals is propagated. In this case, the reception amplification circuit 23 is not necessary. Further, in this case, the duplexer 53b may be constituted of only the transmission filter L-Tx of the transmission filter L-Tx and the reception filter L-Rx.

The diplexer 70 is a multiplexer including a common input-output terminal 100, an input-output terminal 171 (first input-output terminal), an input-output terminal 172 (second input-output terminal), and wide-band filters 70L and 70M. In addition, the diplexer 70 may be a multiplexer configured to perform demultiplexing and multiplexing of two high frequency signals of the plurality of frequency band groups as in the present embodiment or configured to perform demultiplexing and multiplexing of three or more high frequency signals.

The wide-band filter 70L is a first wide-band filter that is connected to the common input-output terminal 100 and the input-output terminal 171 and sets a frequency range including the first frequency band group and the second frequency band group as a pass band.

The wide-band filter 70M is a second wide-band filter that is connected to the common input-output terminal 100 and the input-output terminal 172 and sets a frequency range of the third frequency band group as a pass band.

With the above configuration, high frequency transmission signals outputted from the transmission filters D-Tx, E-Tx, and G-Tx are inputted to the input-output terminal 171, and a high frequency transmission signal outputted from the transmission filter L-Tx is inputted to the input-output terminal 172.

Here, the frequency of the second-order harmonic of the high frequency transmission signal of the band D ($2 \times F_D$) overlaps the band L.

The switch circuit 60 includes a common terminal 60a and selection terminals 60b, 60c and 60d, and performs switching among the connection of the input-output terminal 171 with the transmission filter D-Tx, the connection of the input-output terminal 171 with the transmission filter E-Tx, and the connection of the input-output terminal 171 with the transmission filter G-Tx. The switch circuit 60 is, for example, a single pole triple throw (SP3T) type switch. The switch circuit 60 is not necessarily a constituent element in such operations in which the high frequency transmission signal of the band D is propagated through the transmission filter D-Tx, the high frequency transmission signal of the band E is propagated through the transmission filter E-Tx, and the high frequency transmission signal of the band G is propagated through the transmission filter G-Tx.

According to the above-described configuration of the high frequency front-end circuit 3, it is possible to simultaneously transmit (CA: carrier aggregation) high frequency signals of one or more bands among the plurality of bands D, E, and G belonging to the first frequency band group and the second frequency band group, and a high frequency signal of the band L belonging to the third frequency band group. Further, according to the configuration of the high frequency front-end circuit 3, simultaneous reception can be performed in addition to the above-mentioned simultaneous transmission.

Here, in the high frequency front-end circuit 3, the second-order harmonic of the band D ($2 \times F_D$) belonging to the first frequency band group overlaps the band L belonging to the third frequency band group. For this reason, in order to prevent propagation loss of the band L from being worsened due to the above second-order harmonic when the simultaneous transmission of the band D and the band L is performed, the output matching circuit 31 needs to allow the band D to pass through with low loss and sufficiently attenuate the second-order harmonic of the band D. Further, in a case where, in addition to the above simultaneous transmission, simultaneous reception of the band D and the band L is performed at the same time, since the reception band of the band L overlaps the second-order harmonic of the band D, it is necessary to sufficiently attenuate the second-order harmonic of the band D so as not to lower the reception sensitivity and the like of the band L.

According to the above configuration, the band E belongs to the second frequency band group, and the signal path of the band E is connected to the transmission amplification circuit 12. With this, since the output matching circuit 31 does not need to take into consideration the insertion loss of the band E, it is possible to achieve both low loss of the high frequency transmission signal of the band D and large attenuation of the second-order harmonic of the band D.

Meanwhile, since the output matching circuit 32 connected to the transmission amplification circuit 12 includes the impedance-variable circuit for varying the impedance matching in the pass band in response to the band E and the band G, high frequency transmission signals of the band E and the band G can be transmitted with low loss.

Therefore, with the high frequency front-end circuit 3 according to the present embodiment, it is possible to perform CA, with low loss, of the first and second frequency band groups and the third frequency band group, while sufficiently attenuating the harmonic of the band D positioned at the high frequency-side end portion of the first frequency band group.

Next, of the constituent elements of the communication device 6 according to the present embodiment, constituent elements other than the high frequency front-end circuit 3 will be described.

The RFIC 4 is an RF signal processing circuit configured to process a high frequency signal transmitted and received by the antenna element 2. Specifically, the RFIC 4 performs signal processing, by down-conversion or the like, on a high frequency reception signal inputted from the antenna element 2 through the high frequency front-end circuit 3, and outputs the high frequency reception signal generated by the above signal processing to the BBIC 5. Further, the RFIC 4 performs signal processing, by up-conversion or the like, on a transmission signal inputted from the BBIC 5, and outputs the high frequency transmission signal generated by the above signal processing to the high frequency front-end circuit 3.

In addition, in the present embodiment, the RFIC 4 also has a function as a control unit configured to control the connections of the switch circuits 40 and 60 included in the high frequency front-end circuit 3 based on the band (frequency band) to be used. Specifically, the RFIC 4 switches the connections of the switch circuits 40 and 60 by a control signal (not illustrated). The control unit may be provided outside the RFIC 4, or may be provided in, for example, the high frequency front-end circuit 3 or the BBIC 5.

According to the above-described configuration of the communication device 6, it is possible to perform CA, with low loss, of the first and second frequency band groups, and the third frequency band group, while sufficiently attenuating the harmonic of the band D positioned at the high frequency-side end portion of the first frequency band group.

Figure 2:
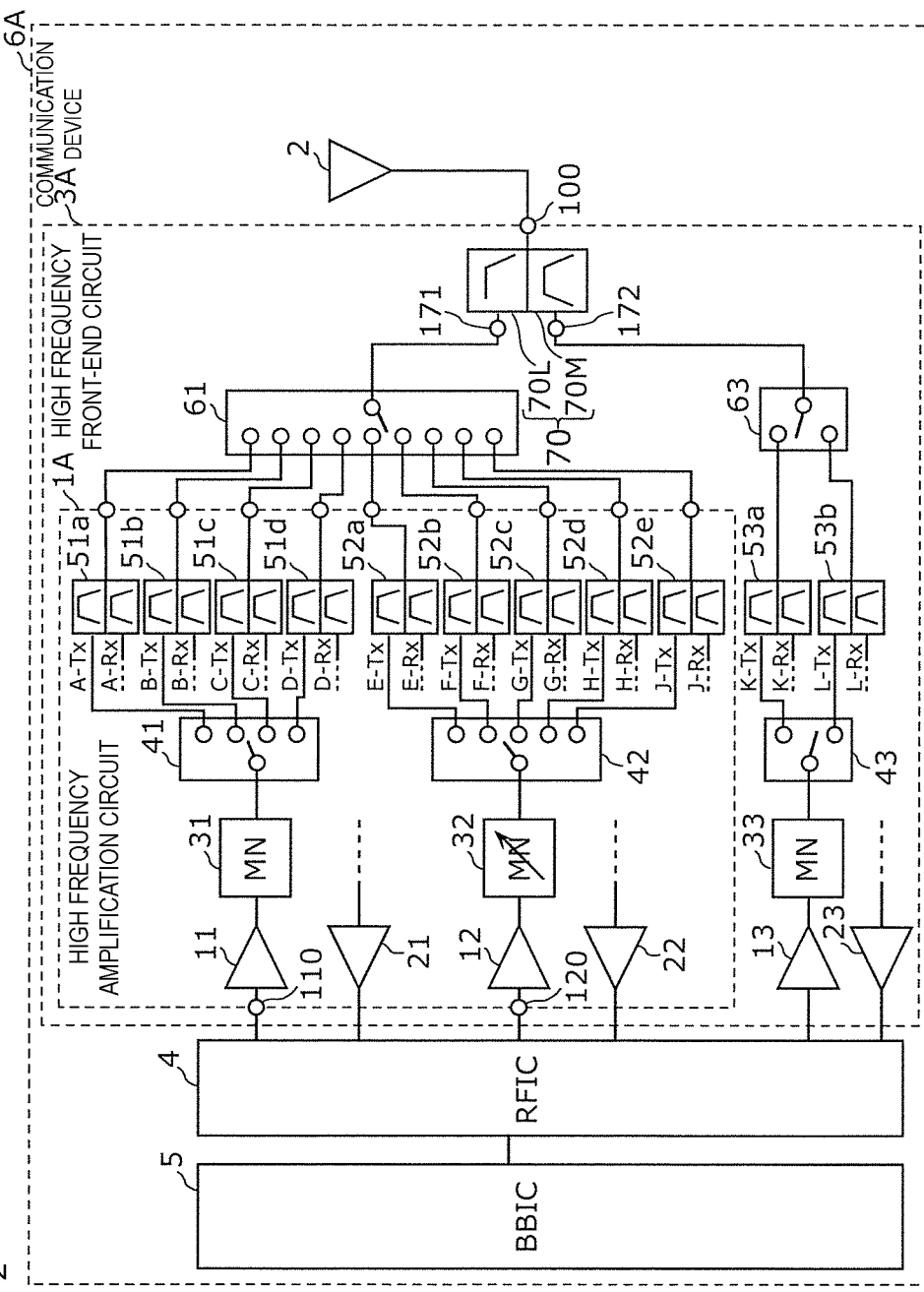
FIG. 2 is a circuit configuration diagram of a communication device according to a working example.

1.2 High Frequency Front-End Circuit Configurations According to Working Example and Comparative Example FIG. 2 is a circuit configuration diagram of a communication device 6A according to a working example. The communication device 6A illustrated in FIG. 2 is a specific circuit of the communication device 6 according to the embodiment illustrated in FIG. 1, in which the number of bands belonging to each of the frequency band groups is increased. Hereinafter, as for the communication device 6A according to the working example, description of the same constituent elements as those of the communication device 6 according to the embodiment will be omitted, and different constituent elements therefrom will be mainly described.

As illustrated in FIG. 2, the communication device 6A includes an antenna element 2, a high frequency front-end circuit 3A, an RFIC 4, and a BBIC 5.

The high frequency front-end circuit 3A includes a high frequency amplification circuit 1A, switch circuits 43, 61 and 63, a diplexer 70, a transmission amplification circuit 13, a reception amplification circuit 23, an output matching circuit 33, and duplexers 53a and 53b.

The high frequency amplification circuit 1A includes transmission amplification circuits 11 and 12, duplexers 51a, 51b, 51c, 51d, 52a, 52b, 52c, 52d and 52e, output matching circuits 31 and 32, reception amplification circuits 21 and 22, and switch circuits 41 and 42.

The duplexer 51a is a duplexer that is constituted of a transmission filter A-Tx and a reception filter A-Rx and sets a band A belonging to the first frequency band group as a pass band. The transmission filter A-Tx sets a transmission band of the band A as a pass band. The band A is, for example, Band 71 of Long Term Evolution (LTE) (transmission band: 663 to 698 MHz, reception band: 617 to 652 MHz).

The duplexer 51b is a duplexer that is constituted of a transmission filter B-Tx and a reception filter B-Rx and sets a band B belonging to the first frequency band group as a pass band. The transmission filter B-Tx sets a transmission band of the band B as a pass band. The band B is, for example, Band 12 of LTE (transmission band: 699 to 716 MHz, reception band: 729 to 746 MHz).

The duplexer 51c is a duplexer that is constituted of a transmission filter C-Tx and a reception filter C-Rx and sets a band C belonging to the first frequency band group as a pass band. The transmission filter C-Tx sets a transmission band of the band C as a pass band. The band C is, for example, Band 28A of LTE (transmission band: 703 to 733 MHz, reception band: 758 to 788 MHz).

The duplexer 51d is a duplexer that is constituted of a transmission filter D-Tx and a reception filter D-Rx and sets a band D (first band) belonging to the first frequency band group as a pass band. The transmission filter D-Tx is a first filter whose pass band is a transmission band of the band D (first band). The band D is, for example, Band 28B of LTE (transmission band: 718 to 748 MHz, reception band: 773 to 803 MHz).

The duplexer 52a is a duplexer that is constituted of a transmission filter E-Tx and a reception filter E-Rx and sets a band E (second band) belonging to the second frequency band group as a pass band. The transmission filter E-Tx is a second filter whose pass band is a transmission band of the band E (second band). The band E is, for example, Band 13 of LTE (transmission band: 777 to 787 MHz, reception band: 746 to 756 MHz).

The duplexer 52b is a duplexer that is constituted of a transmission filter F-Tx and a reception filter F-Rx and sets a band F belonging to the second frequency band group as a pass band. The transmission filter F-Tx sets a transmission band of the band F as a pass band. The band F is, for example, Band 14 of LTE (transmission band: 788 to 798 MHz, reception band: 758 to 768 MHz).

The duplexer 52c is a duplexer that is constituted of a transmission filter G-Tx and a reception filter G-Rx, and sets, as a pass band, a band G (third band) belonging to the second frequency band group and positioned on a high frequency side relative to the band E (second band). The transmission filter G-Tx is a third filter whose pass band is a transmission band of the band G (third band). The band G is, for example, Band 20 of LTE (transmission band: 832 to 862 MHz, reception band: 791 to 821 MHz).

The duplexer 52d is a duplexer that is constituted of a transmission filter H-Tx and a reception filter H-Rx and sets a band H belonging to the second frequency band group as a pass band. The transmission filter H-Tx sets a transmission band of the band H as a pass band. The band H is, for example, Band 26 of LTE (transmission band: 814 to 849 MHz, reception band: 859 to 894 MHz).

The duplexer 52e is a duplexer that is constituted of a transmission filter J-Tx and a reception filter J-Rx and sets a band J belonging to the second frequency band group as a pass band. The transmission filter J-Tx sets a transmission band of the band J as a pass band. The band J is, for example, Band 8 of LTE (transmission band: 880 to 915 MHz, reception band: 925 to 960 MHz).

The output matching circuit 31 is a first output matching circuit disposed between an output terminal of the transmission amplification circuit 11 and input terminals of the transmission filters A-Tx, B-Tx, C-Tx and D-Tx, and is configured to achieve impedance matching between the transmission amplification circuit 11 and the respective transmission filters A-Tx to D-Tx. The output matching circuit 31 is connected to the transmission filters A-Tx, B-Tx, C-Tx, and D-Tx via the switch circuit 41.

The output matching circuit 32 is a second output matching circuit disposed between an output terminal of the transmission amplification circuit 12 and input terminals of the transmission filters E-Tx, F-Tx, G-Tx, H-Tx and J-Tx, and is configured to achieve impedance matching between the transmission amplification circuit 12 and the respective transmission filters E-Tx to J-Tx. The output matching circuit 32 is connected to the transmission filters E-Tx, F-Tx, G-Tx, H-Tx and J-Tx via the switch circuit 42.

The switch circuit 41 performs switching among the connections of the output matching circuit 31 with the transmission filters A-Tx to D-Tx. The switch circuit 40 is, for example, a single pole 4-throw (SP4T) type switch. The switch circuit 42 performs switching among the connections of the output matching circuit 32 with the transmission filters E-Tx to J-Tx. The switch circuit 42 is, for example, a single pole 5-throw (SP5T) type switch.

The reception amplification circuit 21 amplifies a high frequency reception signal of the first frequency band group having passed through any of the reception filters A-Rx to D-Rx. The reception amplification circuit 22 amplifies a high frequency reception signal of the second frequency band group having passed through any of the reception filters E-Rx to J-Rx.

Next, of the constituent elements of the high frequency front-end circuit 3A according to the present working example, constituent elements other than the high frequency amplification circuit 1A will be described.

The transmission amplification circuit 13 is a third transmission amplification circuit configured to amplify a high frequency transmission signal of the third frequency band group positioned on a high frequency side relative to the second frequency band group.

The duplexer 53a is a duplexer that is constituted of a transmission filter K-Tx and a reception filter K-Rx and sets a band K belonging to the third frequency band group as a pass band. The transmission filter K-Tx sets a transmission band of the band K as a pass band. The band K is, for example, Band 11 of LTE (transmission band: 1427.9 to 1447.9 MHz, reception band: 1475.9 to 1495.9 MHz).

The duplexer 53b is a duplexer that is constituted of a transmission filter L-Tx and a reception filter L-Rx and sets a band L (fourth band) belonging to the third frequency band group as a pass band. The transmission filter L-Tx is a fourth filter whose pass band is a transmission band of the band L (fourth band). The band L is, for example, Band 21 of LTE (transmission band: 1447.9 to 1462.9 MHz, reception band: 1495.9 to 1510.9 MHz).

The reception amplification circuit 23 amplifies a high frequency reception signal of the third frequency band group having passed through the reception filter K-Rx or L-Rx.

The output matching circuit 33 is a circuit disposed between an output terminal of the transmission amplification circuit 13 and input terminals of the transmission filters K-Tx to L-Tx and is configured to achieve impedance matching between the transmission amplification circuit 13 and the transmission filters K-Tx to L-Tx. The output matching circuit 33 is connected to the transmission filters K-Tx to L-Tx via the switch circuit 43.

The switch circuit 43 performs switching among the connections of the output matching circuit 33 with the transmission filters K-Tx to L-Tx. The switch circuit 43 is, for example, an SPDT type switch.

The diplexer 70 is a multiplexer including a common input-output terminal 100, an input-output terminal 171 (first input-output terminal), an input-output terminal 172 (second input-output terminal), and wide-band filters 70L and 70M. In addition, the diplexer 70 may be a multiplexer configured to perform demultiplexing and multiplexing of two high frequency signals of the plurality of frequency band groups as in the present embodiment or configured to perform demultiplexing and multiplexing of three or more high frequency signals.

The wide-band filter 70L is a first wide-band filter that is connected to the common input-output terminal 100 and the input-output terminal 171 and sets a frequency range including the first frequency band group and the second frequency band group as a pass band.

The wide-band filter 70M is a second wide-band filter that is connected to the common input-output terminal 100 and the input-output terminal 172 and sets a frequency range of the third frequency band group as a pass band.

The switch circuit 61 performs switching among the connections of the input-output terminal 171 with the transmission filters A-Tx to J-Tx. The switch circuit 61 is, for example, a single pole 9-throw (SP9T) type switch. The switch circuit 63 performs switching among the connections of the input-output terminal 172 with the transmission filters K-Tx to L-Tx. The switch circuit 63 is, for example, an SPDT type switch.

With the above configuration, high frequency transmission signals outputted from the transmission filters A-Tx to J-Tx are inputted to the input-output terminal 171, and high frequency transmission signals outputted from the transmission filters K-Tx to L-Tx are inputted to the input-output terminal 172.

According to the above-described configuration of the high frequency front-end circuit 3A, it is possible to perform CA in which high frequency signals of one or more bands among the plurality of bands A to J belonging to the first frequency band group and the second frequency band group, and high frequency signals of the bands K to L belonging to the third frequency band group are simultaneously transmitted.

Here, in the high frequency front-end circuit 3A, the second-order harmonic (1436 to 1496 MHz) of the band D (Band 28B) belonging to the first frequency band group overlaps the transmission band (1447.9 to 1462.9 MHz) of the band L (Band 21) belonging to the third frequency band group. Therefore, in order to prevent the insertion loss of the band L from being worsened due to the second-order harmonic when the simultaneous transmission (CA) of the band D and the band L is performed, the output matching circuit 31 needs to allow the band D to pass through with low loss and sufficiently attenuate the second-order harmonic of the band D. Further, in a case where, in addition to the above simultaneous transmission, simultaneous reception of the band D and the band L is performed at the same time, since the reception band (1495.9 to 1510.9 MHz) of the band L (Band 21) overlaps the second-order harmonic (1436 to 1496 MHz) of the band D (Band 28B), it is necessary to sufficiently attenuate the second-order harmonic of the band D so as not to lower the reception sensitivity and the like of the band L.

Figure 3:
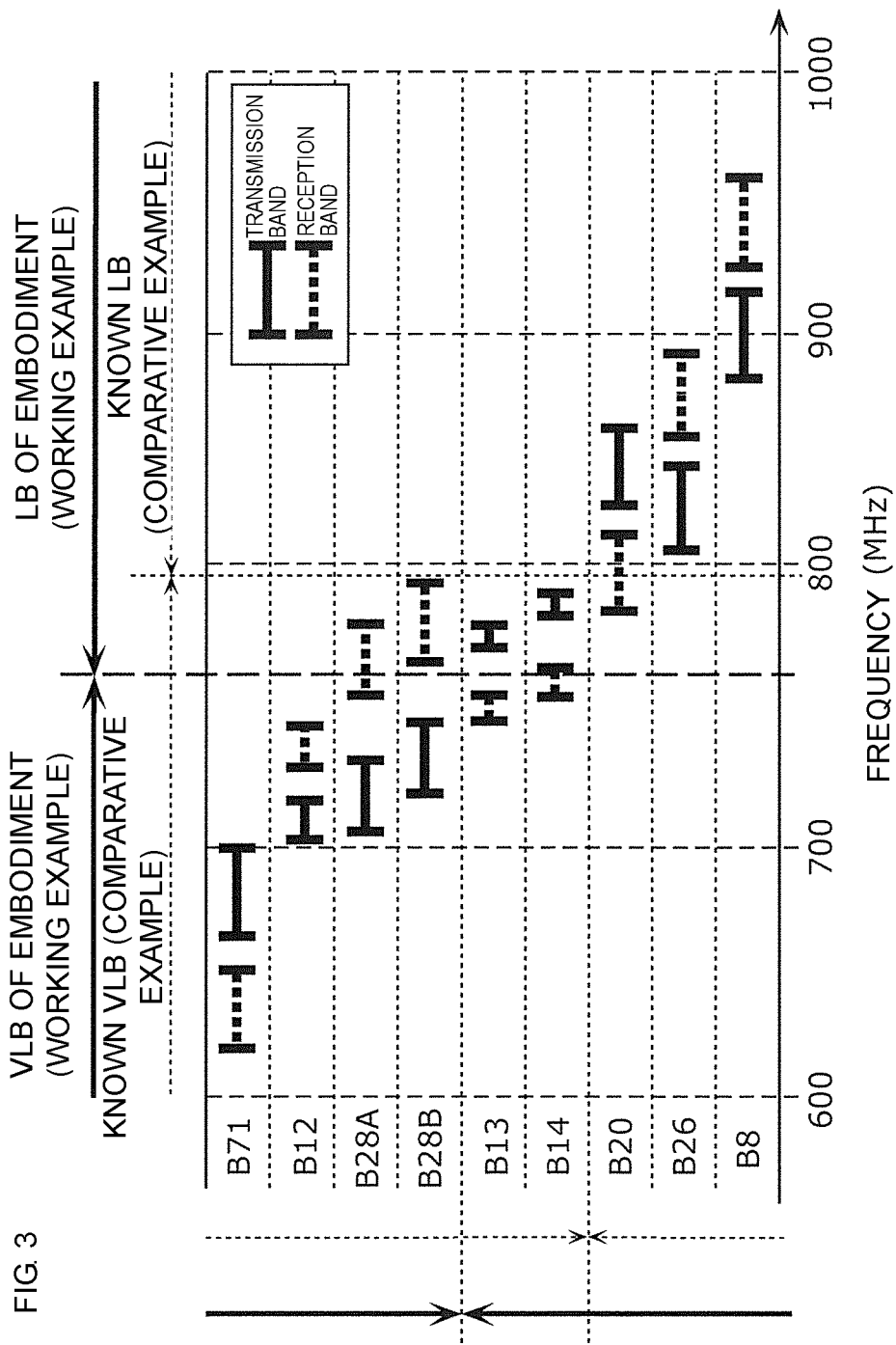
FIG. 3 is a diagram illustrating a relationship between two frequency band groups and respective bands in an embodiment and a known art.

FIG. 3 is a diagram illustrating a relationship between two frequency band groups and respective bands in the embodiment (working example) and a known art (comparative example). As illustrated in FIG. 3, frequencies of the transmission bands of the respective bands exemplified in the high frequency amplification circuit 1A according to the working example are as follows when cited in the ascending order: Band 71, Band 12, Band 28A, Band 28B, Band 13, Band 14, Band 26, Band 20 and Band 8.

In the frequency allocation of the known art (comparative example), Bands between 71 and 14 belong to a very low band group (VLB group: first frequency band group), while Bands between 20 and 8 belong to a low band group (LB group: second frequency band group).

On the other hand, in the frequency allocation in the present embodiment (working example), Bands from 71 to 28B belong to the VLB group (first frequency band group), while Bands from 13 to 8 belong to the LB group (second frequency band group).

In other words, in the high frequency amplification circuit 1A according to the present working example, Band 28B is positioned at a high frequency-side end portion in the frequency range of the VLB group, Band 13 is positioned at a low frequency-side end portion in the frequency range of the LB group, and a frequency of the second-order harmonic of the high frequency transmission signal of Band 28B ($2 \times F_D$: 1436 to 1496 MHz) is higher than Band 13 (transmission band: 777 to 787 MHz).

Figure 4A:
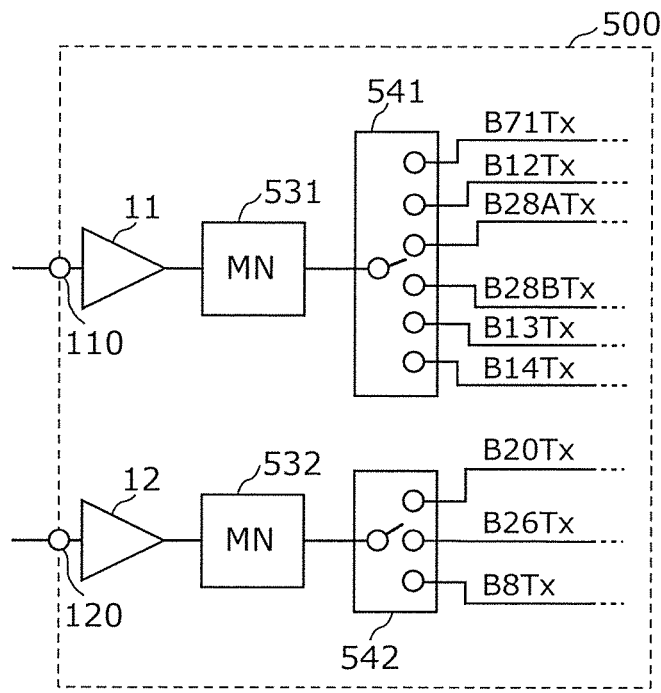
FIG. 4A is a schematic circuit configuration diagram of a high frequency amplification circuit according to a comparative example.

FIG. 4A is a schematic circuit configuration diagram of a high frequency amplification circuit 500 according to the comparative example. As illustrated in FIG. 4A, the high frequency amplification circuit 500 includes transmission amplification circuits 11 and 12, transmission filters B71Tx, B12Tx, B28ATx, B28BTx, B13Tx, B14Tx, B20Tx, B26Tx and B8Tx, output matching circuits 531 and 532 and switch circuits 541 and 542. In the high frequency amplification circuit 500 according to the comparative example, a reception system circuit is omitted. The high frequency amplification circuit 500 according to the comparative example is different from the high frequency amplification circuit 1A according to the working example in that the transmission filters B13Tx (transmission filter of Band 13) and B14Tx (transmission filter of Band 14) are arranged on the side of the VLB group (first frequency band group).

Figure 4B:
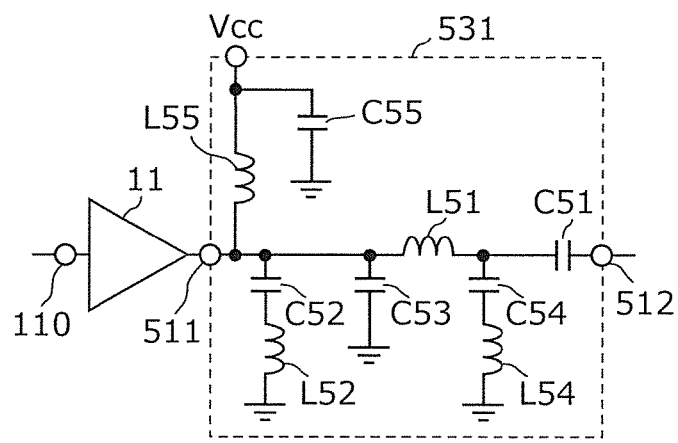
FIG. 4B is a circuit configuration diagram of a first output matching circuit according to a comparative example.

FIG. 4B is a circuit configuration diagram of the output matching circuit 531 according to the comparative example. The output matching circuit 531 illustrated in FIG. 4B includes capacitors C51, C52, C53, C54 and C55, and inductors L51, L52, L54 and L55.

The inductor L51 and the capacitor C51 are connected in series to a path connecting an input terminal 511 of the output matching circuit 531, which is an output terminal of the transmission amplification circuit 11, and an output terminal 512 of the output matching circuit 531. The capacitor C52 is disposed between a first connection node, which is a connection point of the input terminal 511 and the inductor L51, and the ground. The capacitor C53 is disposed between a second connection node, which is a connection point of the first connection node and the inductor L51, and the ground. The capacitor C54 is disposed between a third connection node, which is a connection point of the inductor L51 and the capacitor C51, and the ground. The inductor L52 is connected to the capacitor C52 and to the ground. The inductor L54 is connected to the capacitor C54 and to the ground. The inductor L55 is connected to the first connection node and a drive power supply (Vcc), and the capacitor C55 is connected to the drive power supply (Vcc) and to the ground.

With the connection configuration described above, the inductor L51 and the capacitor C52 constitute a low-pass filter in which the frequency range of the VLB group (first frequency band group) is set as a pass band. A series connection circuit of the capacitor C52 and the inductor L52 forms an attenuation pole of the second-order harmonic of Band 28B in the low-pass filter described above. In addition, a series connection circuit of the capacitor C54 and the inductor L54 forms an attenuation pole of the third-order harmonic of Band 28B in the low-pass filter described above. The capacitor C53 has a function to achieve power matching and efficiency matching of the transmission amplification circuit 11. The capacitor C51 is a so-called DC cut capacitor for removing DC components of the high frequency transmission signal outputted from the transmission amplification circuit 11. The inductor L55 and the capacitor C55 form a matching circuit for securing isolation between the high frequency transmission signal outputted from the transmission amplification circuit 11 and a DC voltage supplied from the drive power supply (Vcc).

Figure 4C:
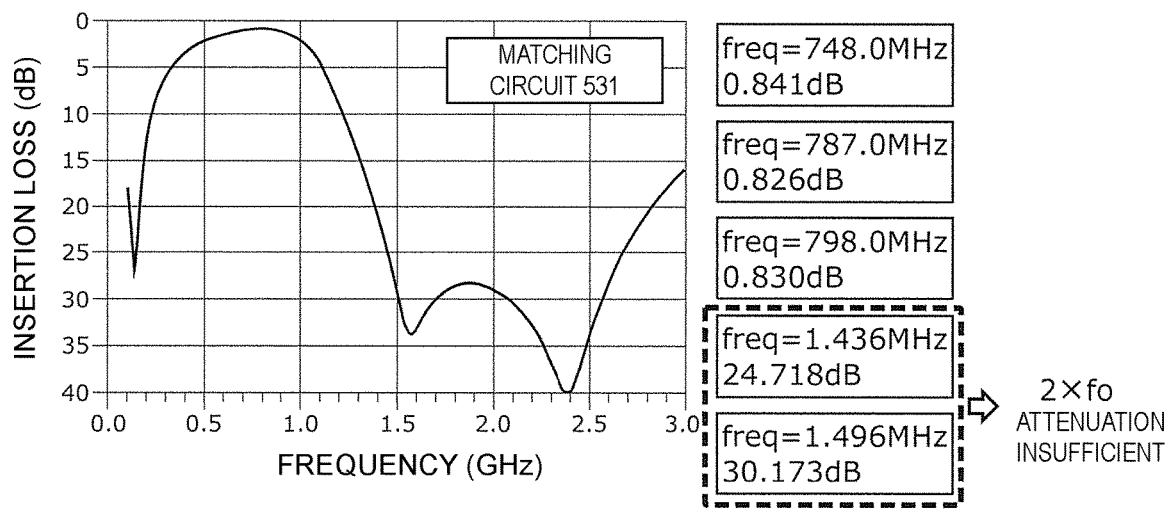
FIG. 4C is a graph showing bandpass characteristics of the first output matching circuit according to the comparative example.

FIG. 4C is a graph showing bandpass characteristics of the output matching circuit 531 according to the comparative example. As shown in FIG. 4C, the output matching circuit 531 has bandpass characteristics in which the VLB group (first frequency band group), from Band 71 to Band 14, is set as a pass band, and a low middle band (LMB) group (third frequency band group) to which Band 11 and Band 21, which are partner bands in CA, belong is set as an attenuation band. Here, in the high frequency amplification circuit 500 according to the comparative example, since the output matching circuit 531 needs to pass the high frequency transmission signals of Band 71 to Band 14 therethrough, it is necessary to pass Band 13 (transmission band: 777 to 787 MHz) and Band 14 (transmission band: 788 to 798 MHz) therethrough with low loss. Due to this, in FIG. 4C, the insertion loss of Band 28B is about 0.841 dB (about 0.725 dB after the removal of reflection loss), and in addition, the insertion loss of Band 13 is about 0.826 dB (about 0.765 dB after the removal of reflection loss) and the insertion loss of Band 14 is about 0.830 dB (about 0.780 dB after the removal of reflection loss); that is, low loss is secured in Bands 13 and 14 as well along with Band 28B.

However, in order to secure the low loss in Bands 13 and 14, attenuation (about 24.718 dB) is insufficient in the second-order harmonic (1436 to 1496 MHz) of Band 28B.

In contrast, in the high frequency amplification circuit 1A according to the present working example, Bands from 71 to 28B belong to the VLB group (first frequency band group) and are propagated through the transmission amplification circuit 11 and the output matching circuit 31, and Bands from 13 to 8 belong to the LB group (second frequency band group) and are propagated through the transmission amplification circuit 12 and the output matching circuit 32.

Figure 5A:
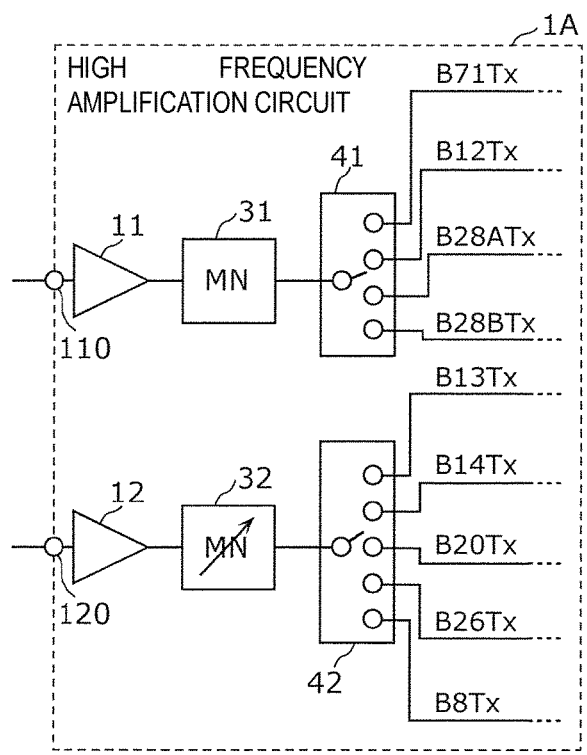
FIG. 5A is a schematic circuit configuration diagram of a high frequency amplification circuit according to a working example.

FIG. 5A is a schematic circuit configuration diagram of the high frequency amplification circuit 1A according to the working example. As illustrated in FIG. 5A, the high frequency amplification circuit 1A includes the transmission amplification circuits 11 and 12, transmission filters B71Tx, B12Tx, B28ATx, B28BTx, B13Tx, B14Tx, B20Tx, B26Tx and B8Tx, the output matching circuits 31 and 32 and the switch circuits 41 and 42. Note that, in the high frequency amplification circuit 1A illustrated in FIG. 5A, a reception system circuit is omitted. The high frequency amplification circuit 1A according to the working example is different from the high frequency amplification circuit 500 according to the comparative example in that the transmission filters B13Tx and B14Tx are arranged on the LB group (second frequency band group) side.

Figure 5B:
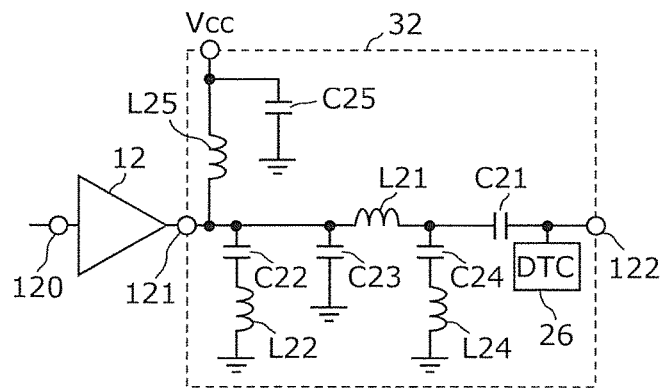
FIG. 5B is a circuit configuration diagram of a second output matching circuit according to a working example.

FIG. 5B is a circuit configuration diagram of the output matching circuit 32 according to the working example. The output matching circuit 32 illustrated in FIG. 5B includes capacitors C21, C22, C23, C24 and C25, inductors L21, L22, L24 and L25, and a digital tunable capacitor (DTC) 26.

The inductor L21 and the capacitor C21 are connected in series to a path connecting an input terminal 121 of the output matching circuit 32, which is an output terminal of the transmission amplification circuit 12, and an output terminal 122 of the output matching circuit 32. The capacitor C22 (second capacitor) is disposed between a first connection node, which is a connection point of the input terminal 121 and the inductor L21, and the ground. The capacitor C23 is disposed between a second connection node, which is a connection point of the first connection node and the inductor L21, and the ground. The capacitor C24 is disposed between a third connection node, which is a connection point of the inductor L21 and the capacitor C21, and the ground. The inductor L22 (second inductor) is connected to the capacitor C22 and to the ground. The inductor L24 is connected to the capacitor C24 and to the ground. The inductor L25 is connected to the first connection node and a drive power supply (Vcc) described above, and the capacitor C25 is connected to the drive power supply (Vcc) and to the ground.

With the connection configuration described above, the inductor L21 and the capacitor C22 constitute a low-pass filter in which the frequency range of the LB group (second frequency band group) is set as a pass band. A series connection circuit of the capacitor C22 and the inductor L22 forms an attenuation pole of the second-order harmonic of Band 13 to Band 8 in the low-pass filter described above. A series connection circuit of the capacitor C24 and the inductor L24 forms an attenuation pole of the third-order harmonic of Band 13 to Band 8 in the low-pass filter described above. The capacitor C23 has a function to achieve power matching and efficiency matching of the transmission amplification circuit 12. The capacitor C21 is a third capacitor, generally called a DC cut capacitor, for removing DC components of the high frequency transmission signal outputted from the transmission amplification circuit 12. The inductor L25 and the capacitor C25 form a matching circuit for securing isolation between the high frequency transmission signal outputted from the transmission amplification circuit 12 and a DC voltage supplied from the drive power supply (Vcc).

The DTC 26 is connected to a path connecting the capacitor C21 and the output terminal 122. To rephrase, the DTC 26 is disposed between the capacitor C21 and the input terminals of the transmission filters B13Tx to B8Tx. The DTC 26 is a capacitor configured to vary its capacitance value in a stepwise manner in response to the band of the high frequency transmission signal passing through the output matching circuit 32; that is, the capacitance value is varied depending on which bands between Bands 13 and 8 of the LB group is the band of the high frequency transmission signal. Since Bands 13 and 14 that belong to the VLB group in the known art are made to belong to the LB group in the present working example, the transmission amplification circuit 12 and the output matching circuit 32 is required to propagate, with low loss, wide-band high frequency transmission signals ranging from Band 13 to Band 8. Accordingly, in the output matching circuit 32, while maintaining the bandpass characteristics of the low-pass filter constituted of the capacitors C21 to C25 and the inductors L21 to L25, the capacitance value of the DTC 26 is varied in accordance with the selection of Band 13 to Band 8, thereby optimizing impedance matching in accordance with the selected band.

The switching for the capacitance value of the DTC 26 is carried out by the aforementioned control unit. The control unit also controls the connections of the switch circuits 41, 42, 43, 61, and 63 in the high frequency front-end circuit 3A. The control unit may be provided in the RFIC 4 or outside the RFIC 4 or may be provided in the high frequency front-end circuit 3A or in the BBIC 5, for example.

With the above-discussed configuration of the output matching circuit 32, the capacitor C22 makes it possible to function as a low-pass filter, the adjustment of the inductor L22 makes it possible to adjust the frequency of the attenuation pole closest to the pass band, and the attenuation pole can be set to the harmonic frequency of the LB group. Thus, it is possible to increase the attenuation of the harmonics of the LB group.

The series connection circuit of the capacitor C22 and the inductor L22 is disposed at a stage preceding the DC cut capacitor C21, and the DTC 26 is disposed at a stage subsequent to the capacitor C21. With this, even when the capacitance value of the DTC 26 changes, the frequency of the harmonic attenuation pole set by the above series connection circuit will not change. Thus, the pass band and the harmonic attenuation pole in the output matching circuit 32 can be separately set.

Figure 5C:
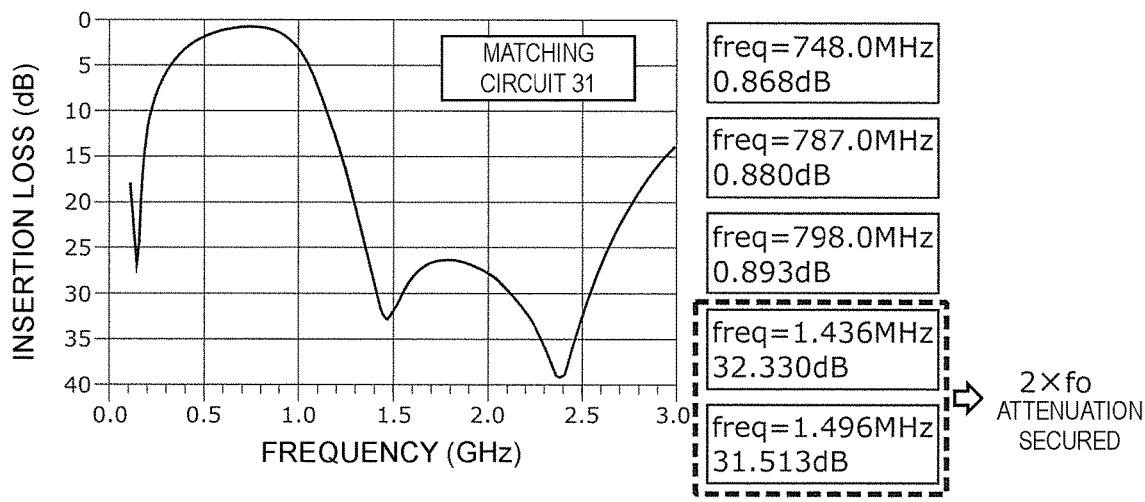
FIG. 5C is a graph showing bandpass characteristics of a first output matching circuit according to a working example.
Figure 5D:
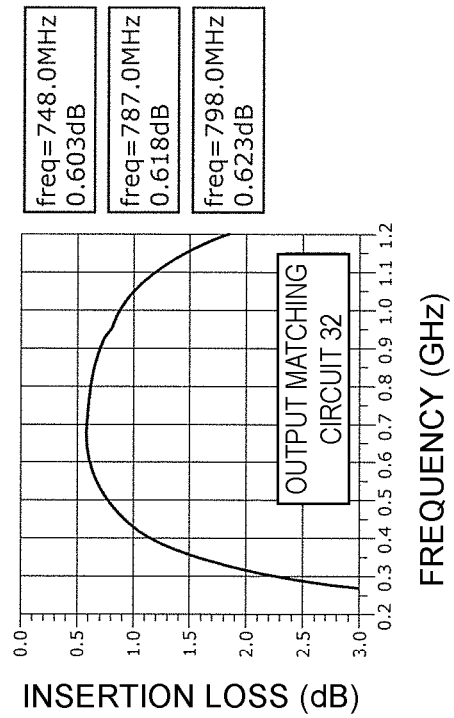
FIGS. 5DA and 5DB include graphs showing bandpass characteristics of the first output matching circuit and the second output matching circuit according to the working example.
Figure 5D:
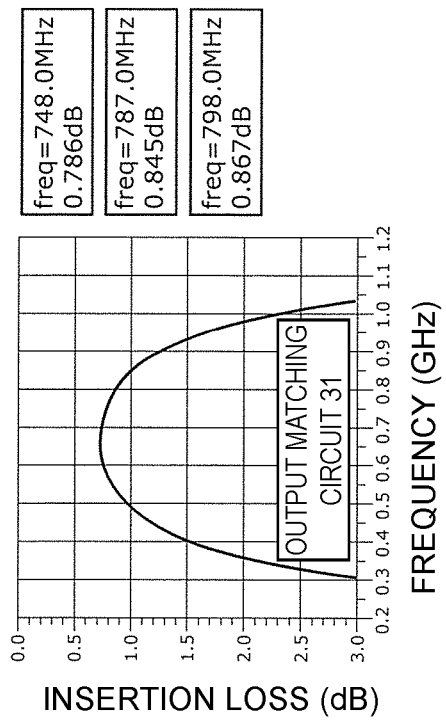

FIG. 5C is a graph showing bandpass characteristics of the output matching circuit 31 according to the working example. FIGS. 5DA and 5DB include graphs showing bandpass characteristics of the output matching circuits 31 and 32 according to the working example. FIG. 5DA shows the bandpass characteristics of the output matching circuit 31 after the removal of reflection loss, and FIG. 5DB shows the bandpass characteristics of the output matching circuit 32 after the optimization of impedance matching in Bands 13 and 14 by adjusting the DTC 26.

First, with reference to FIG. 5C, the bandpass characteristics of the output matching circuit 31 according to the working example will be described. Although the circuit connection configuration of the output matching circuit 31 according to the working example is the same as the circuit connection configuration of the output matching circuit 531 according to the comparative example, the capacitance values of the capacitors and the inductance values of the inductors constituting the output matching circuit 31 are different from the capacitance values of the capacitors and the inductance values of the inductors constituting the output matching circuit 531.

As shown in FIG. 5C, the output matching circuit 31 has bandpass characteristic in which the VLB group (first frequency band group), between Band 71 and Band 28B, is set as a pass band, and the LMB group (third frequency band group) to which Band 11 and Band 21, which are partner bands in CA, belong is set as an attenuation band. Here, in the high frequency amplification circuit 1A according to the working example, since the output matching circuit 31 needs to pass the high frequency transmission signals between Band 71 and Band 28B therethrough, it is necessary for the high frequency transmission signal of bands between Band 71 and Band 28B to pass through with low insertion loss.

In FIG. 5C, the insertion loss of Band 28B is about 0.868 dB (about 0.786 dB after the removal of reflection loss in FIG. 5DA). At the second-order harmonic (1436 to 1496 MHz) of Band 28B, attenuation is about 31.513 dB, which is larger than that in the case of the output matching circuit 531 according to the comparative example, and both low loss of Band 28B and large attenuation of the second-order harmonic of Band 28B are achieved. For achieving this, in the output matching circuit 31, the insertion loss of Band 13 and the insertion loss of Band 14 are respectively about 0.880 dB (about 0.845 dB after the removal of reflection loss in FIG. 5DA) and about 0.893 dB (about 0.867 dB after the removal of reflection loss in FIG. 5DA), which are worse than those in the case of the output matching circuit 531 according to the comparative example. In other words, since Bands 13 and 14 positioned between Band 28B and the second-order harmonic of Band 28B are covered by the output matching circuit 32 side, it is unnecessary to consider the insertion loss of Bands 13 and 14 in the output matching circuit 31.

The output matching circuit 31 according to the working example for achieving the above bandpass characteristics includes a series connection circuit of a first capacitor and a first inductor connected between an output terminal of the transmission amplification circuit 11 and the ground. With this, the first capacitor makes it possible to function as a low-pass filter, and the adjustment of the inductance value of the first inductor makes it possible to adjust the frequency of the attenuation pole closest to the pass band. This attenuation pole is set to the harmonic frequency of the band D (e.g., Band 28B). Thus, it is possible to increase the attenuation of the harmonic of the band D (e.g., Band 28B).

Note that, unlike the DTC 26 of the output matching circuit 32, the first capacitor of the output matching circuit 31 is a capacitance element of a fixed capacitance value type. This makes it possible to fix the frequency of the attenuation pole set to the frequency of the band D (Band 28B) of the VLB group.

On the other hand, as shown in FIG. 5DB, in the output matching circuit 32, since the impedance matching in Band 13 and Band 14 is optimized by adjusting the DTC 26, the insertion loss of Band 13 and the insertion loss of Band 14 are respectively about 0.618 dB and about 0.623 dB, which are significantly improved as compared with the insertion loss of Band 13 and the insertion loss of Band 14 in the output matching circuit 531 according to the comparative example. In other words, the output matching circuit 32 includes the DTC 26 whose capacitance value is varied depending on whether the high frequency transmission signal passing through the output matching circuit 32 is of the band E (e.g., Band 13) or the band G (e.g., Band 20). This makes it possible to separately set, by the single output matching circuit 32, an optimum capacitance value for making the high frequency transmission signal of the band E pass through with low loss and an optimum capacitance value for making the high frequency transmission signal of the band G pass through with low loss, without necessarily separately providing the output matching circuits corresponding to the band E and the band G, respectively. Further, since the wide-band frequency characteristics covering the band E and the band G can be achieved by a variable capacitance element called the "DTC 26", it is possible to reduce the size of the output matching circuit 32. Accordingly, high frequency transmission signals of the wide-band second frequency band group (e.g., the LB group) on which the transmission amplification circuit 12 performs amplification processing, can be transmitted with a low-loss and miniaturized circuit.

FIGS. 6A to 6C are Smith charts showing impedance characteristics of the output matching circuit 32 according to the working example. FIG. 6A shows impedance when the output matching circuit 32 is seen from the output terminal 122 in the case where the capacitance value of the DTC 26 is set to about 1.1 pF. FIG. 6B shows impedance when the output matching circuit 32 is seen from the output terminal 122 in the case where the capacitance value of the DTC 26 is set to about 1.8 pF. FIG. 6C shows impedance when the output matching circuit 32 is seen from the output terminal 122 in the case where the capacitance value of the DTC 26 is set to about 2.5 pF.

In FIG. 6A, by setting the capacitance value of the DTC 26 to about 1.1 pF, the impedance in the transmission band of Band 8 belonging to the LB group is optimized to the reference impedance, and the reflection coefficient of the second-order harmonic of Bands 13, 14, 20, 26 and 8 belonging to the LB group is increased. In FIG. 6B, by setting the capacitance value of the DTC 26 to about 1.8 pF, the impedance in the transmission bands of Bands 20 and 26 belonging to the LB group is optimized to the reference impedance, and the reflection coefficient of the second-order harmonic of Bands 13, 14, 20, 26 and 8 belonging to the LB group is increased. Further, in FIG. 6C, by setting the capacitance value of the DTC 26 to about 2.5 pF, the impedance in the transmission bands of Bands 13 and 14 belonging to the LB group is optimized to the reference impedance, and the reflection coefficient of the second-order harmonic of Bands 13, 14, 20, 26 and 8 belonging to the LB group is increased.

Figure 7A:
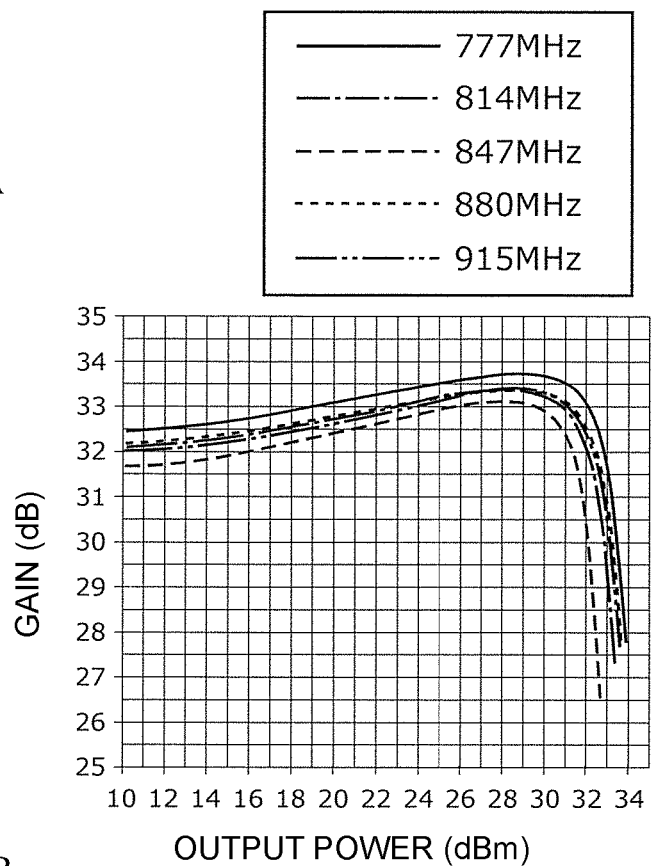
FIGS. 7AA and 7AB include graphs showing gain and efficiency of a transmission path including a second transmission amplification circuit and a second output matching circuit for each band according to a comparative example.
Figure 7A:
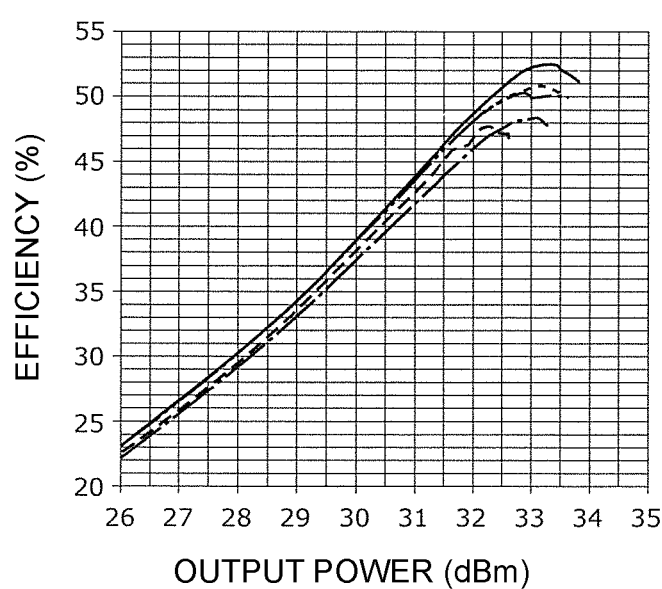
Figure 7B:
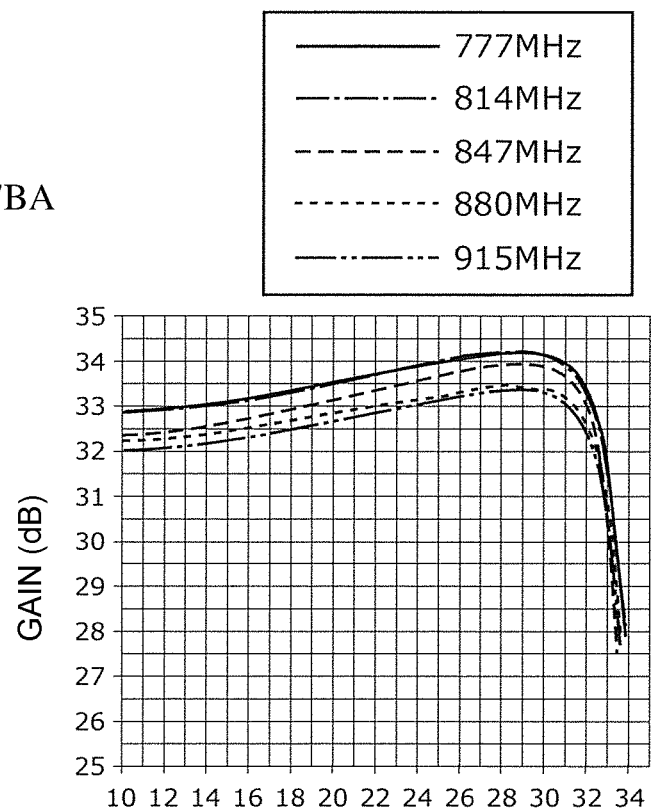
FIGS. 7BA and 7BB include graphs showing gain and efficiency of a transmission path including a second transmission amplification circuit and the second output matching circuit for each band according to a working example.
Figure 7B:
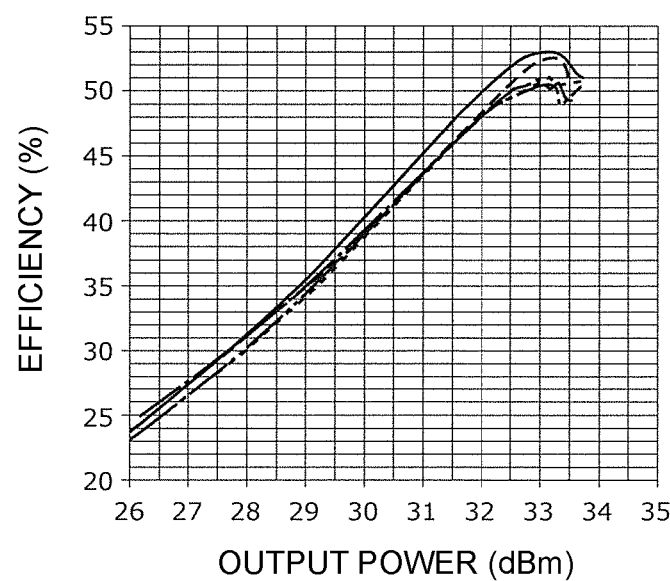

FIGS. 7AA AND 7AB include graphs showing gain (FIG. 7AA) and efficiency (FIG. 7AB) of a transmission path including the transmission amplification circuit 12 and the output matching circuit 532 according to the comparative example. FIGS. 7BA and 7BB include graphs showing gain (FIG. 7BA) and efficiency (FIG. 7BB) of a transmission path including the transmission amplification circuit 12 and the output matching circuit 32 according to the working example.

Comparing FIGS. 7AA and 7AB with FIGS. 7BA and 7BB, it can be understood that variations in both gain and efficiency with respect to the band change (Bands 13, 14, 20, 26 and 8) are smaller in the transmission path including the transmission amplification circuit 12 and the output matching circuit 32 according to the working example than in the transmission path including the transmission amplification circuit 12 and the output matching circuit 532 according to the comparative example.

As described above, with the high frequency front-end circuit 3A according to the working example, since Band 13 or 14 belongs to the LB group, the output matching circuit 31 does not need to take into consideration the insertion loss of Band 13 or 14, thereby making it possible to achieve both low loss of the high frequency transmission signal of Band 28B and large attenuation of the harmonic of Band 28B.

Meanwhile, since Band 13 or 14 belongs to the LB group, the transmission amplification circuit 12 is required to have wide-band amplification characteristics in which Band 13 or 14 positioned at the low frequency-side end portion of the LB group, and Band 20, 26 or 8 positioned at the high frequency side are amplified. On the other hand, since the output matching circuit 32 connected to the transmission amplification circuit 12 includes the impedance-variable circuit configured to vary the pass band in response to, for example, Band 13/14, Band 20/26 and Band 8, high frequency transmission signals of the respective bands in the LB group can be transmitted with low loss.

Accordingly, it is possible to carry out CA of the VLB and LB groups and the LMB group with low loss, while sufficiently attenuating the harmonic of the Band 28B positioned at the high frequency-side end portion of the VLB group.

Note that the type and the number of duplexers constituting the high frequency amplification circuits 1 and 1A according to the present embodiment and the working example respectively, are not limited to the above-described configurations, and are arbitrarily set in accordance with combinations of the bands, the CA of which is carried out. Further, each of the duplexers constituting the high frequency amplification circuits 1 and 1A may be configured by only a transmission filter.

Further, the high frequency front-end circuit 3A according to the present working example includes the circuit configuration to carry out CA of the high frequency signals of the VLB and LB groups and the high frequency signal of the LMB group, and the present working example can be applied to a circuit configured to carry out CA based on combinations of other frequency band groups.

Other Embodiments

Although the high frequency amplification circuit, the high frequency front-end circuit, and the communication device according to the present disclosure have been described with reference to the embodiment and the working example thus far, the present disclosure is not limited to the embodiment and the working example described above. Other embodiments achieved by combining arbitrary constituent elements in the above embodiment and working example, modifications obtained by making various kinds of modifications, conceived by those skilled in the art, on the above-described embodiment without departing from the spirit of the present disclosure, and various types of apparatuses incorporating therein the high frequency amplification circuit, the high frequency front-end circuit and the communication device according to the present embodiment, are also included in the present disclosure.

Moreover, for example, in the high frequency amplification circuit, the high frequency front-end circuit, and the communication device according to the embodiment and the working example, matching elements such as an inductor and a capacitor, and a switch circuit may be connected between the constituent elements. Note that the inductor may include a wiring inductor formed by the wiring connecting the constituent elements. Industrial Applicability The present disclosure can be widely used in communication apparatuses such as cellular phones, as a high frequency amplification circuit, a high frequency front-end circuit, and a communication device applicable to a multi-band system that performs CA modes.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high frequency amplification circuit comprising:
   a first transmission amplification circuit configured to amplify a first high frequency transmission signal of a first frequency band group;
   a second transmission amplification circuit configured to amplify a second high frequency transmission signal of a second frequency band group, the second frequency band group being adjacent to a high frequency side of the first frequency band group;
   a first filter connected to the first transmission amplification circuit, and having a pass band in a first band of the first frequency band group;
   a second filter connected to the second transmission amplification circuit, having a pass band in a second band of the second frequency band group;
   a third filter having a pass band in a third band of the second frequency band group, the third band having higher frequencies than the second band;
   a first output matching circuit disposed between an output terminal of the first transmission amplification circuit and an input terminal of the first filter; and
   a second output matching circuit disposed between an output terminal of the second transmission amplification circuit and input terminals of the second filter and the third filter, wherein:
   the first output matching circuit comprises a low-pass circuit, and
   the second output matching circuit comprises an impedance-variable circuit.

2. The high frequency amplification circuit according to claim 1,
   wherein the first output matching circuit comprises a first capacitor and a first inductor connected in series between the output terminal of the first transmission amplification circuit and ground, and
   the second output matching circuit comprises a digital tunable capacitor (DTC) configured to vary a capacitance value depending on whether a high frequency transmission signal passing through the second output matching circuit is in the second band or the third band.

3. The high frequency amplification circuit according to claim 2,
   wherein the second output matching circuit further comprises a second capacitor and a second inductor connected in series between the output terminal of the second transmission amplification circuit and ground, and a third capacitor disposed in series between the output terminal of the second transmission amplification circuit and input terminals of the second and third filters, the third capacitor being configured to block a direct-current component, and
   the DTC is connected between the third capacitor and the input terminals of the second and third filters.

4. The high frequency amplification circuit according to claim 2, wherein the first capacitor is a fixed capacitance value capacitor.

5. The high frequency amplification circuit according to claim 3, wherein the first capacitor is a fixed capacitance value capacitor.

6. A high frequency front-end circuit comprising:
   the high frequency amplification circuit according to claim 1;
   a third transmission amplification circuit configured to amplify a third high frequency transmission signal of a third frequency band group, the third frequency band group having frequency bands higher than the second frequency band group;
   a fourth filter having a pass band in a fourth band of the third frequency band group; and
   a multiplexer comprising a common input-output terminal, a first input-output terminal, and a second input-output terminal, wherein:
   high frequency transmission signals output from the first filter, the second filter and the third filter are input to the first input-output terminal, and a high frequency transmission signal output from the fourth filter is input to the second input-output terminal, the multiplexer comprises:
  a first wide-band filter that is connected to the common input-output terminal and the first input-output terminal, and that has a pass band including the first frequency band group and the second frequency band group; and
  a second wide-band filter that is connected to the common input-output terminal and the second input-output terminal, and that has a pass band including the third frequency band group, the high frequency front-end circuit is configured to simultaneously transmit the first high frequency transmission signal of the first frequency band group or the second high frequency transmission signal of the second frequency band group, and the third high frequency transmission signal of the third frequency band group, and the third filter is connected to the third transmission amplification circuit.

7. The high frequency front-end circuit according to claim 6, wherein:
the high frequency front-end circuit simultaneously transmits the first high frequency transmission signal of the first band group and the third high frequency transmission signal of the third band group, and the first high frequency transmission signal is in the first band and the third high frequency transmission signal is in the fourth band.

8. The high frequency front-end circuit according to claim 6, wherein the first band is Band 28B of Long Term Evolution (LTE), the second band is Band 13 or 14 of LTE, the third band is any of Bands 20, 26 and 8 of LTE, and the fourth band is Band 11 or 21 of LTE.

9. The high frequency front-end circuit according to claim 7, wherein the first band is Band 28B of Long Term Evolution (LTE), the second band is Band 13 or 14 of LTE, the third band is any of Bands 20, 26 and 8 of LTE, and the fourth band is Band 11 or 21 of LTE.

10. A communication device comprising:
  a radio frequency (RF) signal processing circuit configured to process a high frequency transmission signal; and
  the high frequency front-end circuit according to claim 6, the high frequency front-end circuit being further configured to transmit a high frequency transmission signal output from the RF signal processing circuit to an antenna.

* * * * *